(12) United States Patent
Romano et al.

(10) Patent No.: US 12,140,645 B1
(45) Date of Patent: Nov. 12, 2024

(54) MAGNETIC ELECTRICAL CONTACT SENSOR

(71) Applicant: National Technology & Engineering Solutions of Sandia, LLC, Albuquerque, NM (US)

(72) Inventors: Joshua Romano, Albuquerque, NM (US); Thomas M. Rice, Albuquerque, NM (US); Stephen Neidigk, Albuquerque, NM (US); Michael Bolduc, Albuquerque, NM (US); Elijah David Hammond, Rio Rancho, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 43 days.

(21) Appl. No.: 17/874,498

(22) Filed: Jul. 27, 2022

(51) Int. Cl.
*G01R 31/68* (2020.01)
*H01F 7/08* (2006.01)

(52) U.S. Cl.
CPC ............. *G01R 31/68* (2020.01); *H01F 7/081* (2013.01); *H01F 2007/086* (2013.01)

(58) Field of Classification Search
None
See application file for complete search history.

(56) References Cited

U.S. PATENT DOCUMENTS

| | | | | |
|---|---|---|---|---|
| 3,751,086 A | * | 8/1973 | Geringer | E05B 47/0002 292/144 |
| 4,549,168 A | * | 10/1985 | Sieradzki | G08B 26/002 340/509 |
| 4,573,720 A | * | 3/1986 | Nicolai | E05B 47/00 292/144 |
| 4,904,005 A | * | 2/1990 | Frolov | E05B 45/06 292/144 |
| 5,925,861 A | * | 7/1999 | Fromberg | E05B 15/1621 200/61.67 |
| 2010/0031714 A1 | * | 2/2010 | Brown | E05B 17/2084 70/91 |
| 2022/0200219 A1 | * | 6/2022 | Belisle | H01R 25/145 |
| 2023/0063848 A1 | * | 3/2023 | Beardmore | E05B 65/0035 |

FOREIGN PATENT DOCUMENTS

CN 213303120 U * 5/2021

* cited by examiner

*Primary Examiner* — Mohamed Barakat
*Assistant Examiner* — Rufus C Point
(74) *Attorney, Agent, or Firm* — Daniel J. Jenkins; Kenneth P. McNeill

(57) ABSTRACT

A magnetic electrical latch assembly for sensing an electrical contact has a housing for supporting a magnetic electrical contact. The housing has an annular cavity and a cylinder disposed within the cavity. A magnetic electrical contact is attached at one end to the cylinder. The cylinder is movable axially within the cavity. The magnetic electrical contact has an electrical connection to a first conductive wire. The magnetic electrical contact is arranged to couple with an opposing contact pad to create an electrical connection between an external conductor path and the first conductive wire. Also, a magnetic electrical contact sensor system has a hollow enclosure with a detachable access panel. A meandering conductor path cover a portion of the access panel. The conductor path terminates on a contact pad. A magnetic electrical latch assembly has a housing for supporting the magnetic electrical contact within the enclosure.

20 Claims, 3 Drawing Sheets

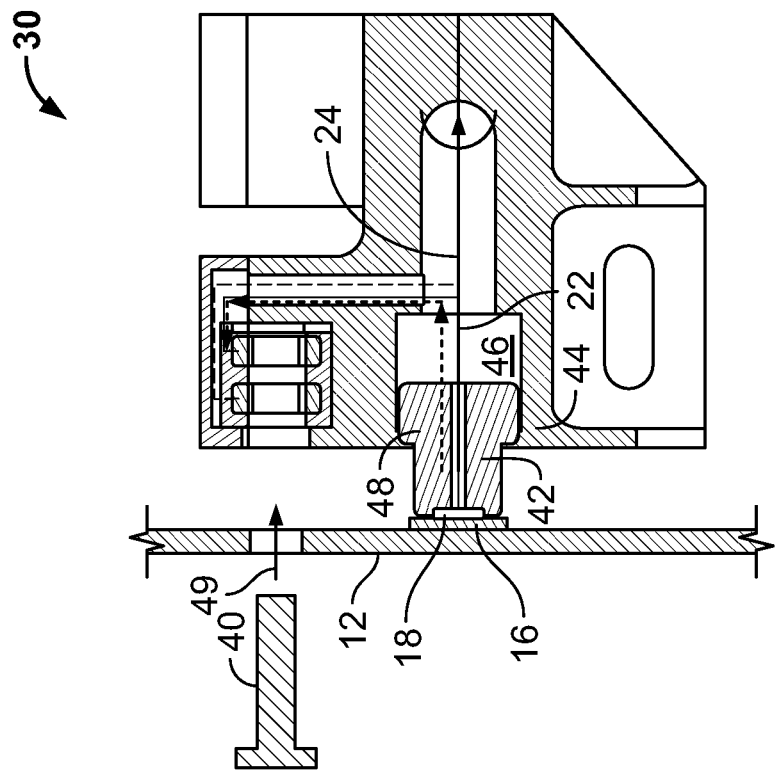
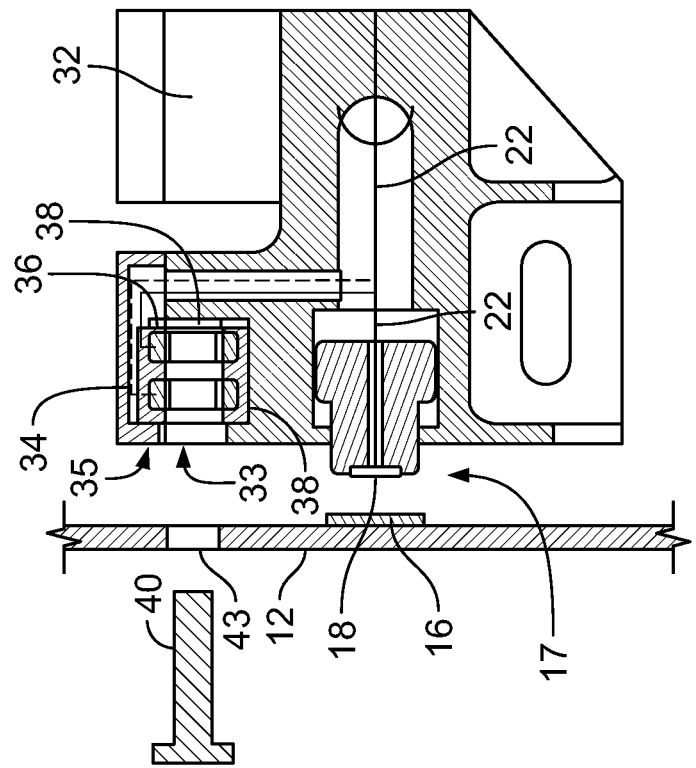
FIG. 3
FIG. 2

MAGNETIC ELECTRICAL CONTACT SENSOR

STATEMENT REGARDING FEDERALLY SPONSORED RESEARCH OR DEVELOPMENT

This invention was developed under Contract No. DE-NA0003525 awarded by the United States Department of Energy/National Nuclear Security Administration. The Government has certain rights in this invention.

BACKGROUND OF THE INVENTION

The application generally relates to a magnetic electrical contact sensor. The application relates more specifically to a magnetic electrical contact sensor and circuit for tamper detection of a secure enclosure.

The invention relates to a novel tamper detection sensor that minimizes the impact of routine operation and maintenance of a device. The tamper detection sensor utilizes conductive magnets that act as a contact switch to detect the position of an exterior panel relative to a fixed surface. The tamper detection sensor employs an electrical continuity circuit throughout the panel to detect whether the panel has been penetrated.

Medical irradiators, complex machinery and electrical equipment are often enclosed within a frame having removable panels. The panels protect users from moving parts and electrical hazards, obscure the contents within the enclosure 11 and make the device more aesthetically appealing. Cover panels often employ tamper resistant fasteners to prevent unauthorized access. Access to the enclosure 11 may be gained, e.g., by removing cover fasteners and removing the panel, or by cutting though an exterior panel.

Furniture magnet latches which holds a cabinet door closed are well known. These magnetic latches are often used to compensate for geometric irregularities in the fit between the door and the frame of a cabinet. The magnet has a limited range of flexibility within which the latch may properly function.

What is needed is a system and/or method that satisfies one or more of these needs or provides other advantageous features. Other features and advantages will be made apparent from the present specification. The teachings disclosed extend to those embodiments that fall within the scope of the claims, regardless of whether they accomplish one or more of the aforementioned needs.

SUMMARY OF THE INVENTION

One embodiment relates to a magnetic electrical latch assembly. The magnetic electrical latch assembly includes a housing for supporting a magnetic electrical contact. The housing has an annular cavity and a cylinder disposed within the cavity. A magnetic electrical contact is attached at one end to the cylinder. The cylinder is movable axially within the cavity. The magnetic electrical contact has an electrical connection to a first conductive wire. The magnetic electrical contact is arranged to couple with an opposing contact pad to create an electrical connection between an external conductor path and the first conductive wire.

Another embodiment discloses a magnetic electrical contact sensor system. The magnetic electrical contact sensor system includes a hollow enclosure. A detachable access panel is attached to a side of the enclosure. A meandering conductor path is arranged to cover at least a portion of the access panel. The meandering conductor path is in electrical communication with a conductive contact pad. A magnetic electrical latch assembly has a housing for supporting a magnetic electrical contact within the enclosure. The housing has an annular cavity and a cylinder disposed within the cavity. A magnetic electrical contact is attached at one end to the cylinder. The cylinder is movable axially within the cavity. The magnetic electrical contact has an electrical connection to a first conductive wire. The magnetic electrical contact is arranged to couple with the conductive contact pad to create an electrical connection between an external conductor path and the first conductive wire.

Another embodiment relates to an alarm system for securing an enclosure. The alarm system for securing an enclosure includes a hollow enclosure; a detachable access panel attached to a side of the enclosure; a meandering conductor path arranged to cover at least a portion of the access panel, the meandering conductor path in electrical communication with a conductive contact pad; and a magnetic electrical latch assembly having a housing for supporting a magnetic electrical contact within the enclosure. One or more resistors are connected in series with the meandering conductor path. An interrogator monitors a resistance value of the meandering conductor path.

Certain advantages of the embodiments described herein include features such that a service technician may simply open a monitored enclosure without damaging the circuit or disconnecting a complex mechanism before accessing the contents.

Another advantage of the invention is the ability to provide protection of many different irregular geometries with a single circuit device and magnetic connection.

Another advantage is the simplicity of the system is inexpensive to implement with the commonly available magnetic components and a plastic bracket which can be injection molded in large quantities.

Another advantage is a device and method for creating a continuity circuit that detects an open circuit through the electrical contact of magnet pairs conducting electrical current. A meandering wire may be attached to the inside surface of the panel and terminate at one or more conductive pads. When the magnets are disposed in close proximity to the pads, the magnet is configured to slide towards the pads and they are coupled to create a closed electrical circuit. The magnet pairs may be uncoupled and recoupled.

The electrical circuit triggers an alarm when the cover panel is pulled away from the frame of the enclosure.

An alarm may also be triggered if the meandering wire that is embedded on a panel surface is cut, e.g., by drilling a hole in the surface.

Alternative exemplary embodiments relate to other features and combinations of features as may be generally recited in the claims.

BRIEF DESCRIPTION OF THE DRAWINGS

The application will become more fully understood from the following detailed description, taken in conjunction with the accompanying figures, wherein like reference numerals refer to like elements, in which:

FIG. 2 shows a cross-sectional elevation of an exemplary magnetic contact sensor.

FIG. 3 shows the cross-sectional elevation of an exemplary magnetic contact sensor with current flow through the sensor contacts.

DETAILED DESCRIPTION OF THE INVENTION

Before turning to the figures which illustrate the exemplary embodiments in detail, it should be understood that the application is not limited to the details or methodology set forth in the following description or illustrated in the figures. It should also be understood that the phraseology and terminology employed herein is for the purpose of description only and should not be regarded as limiting.

Figure 1:
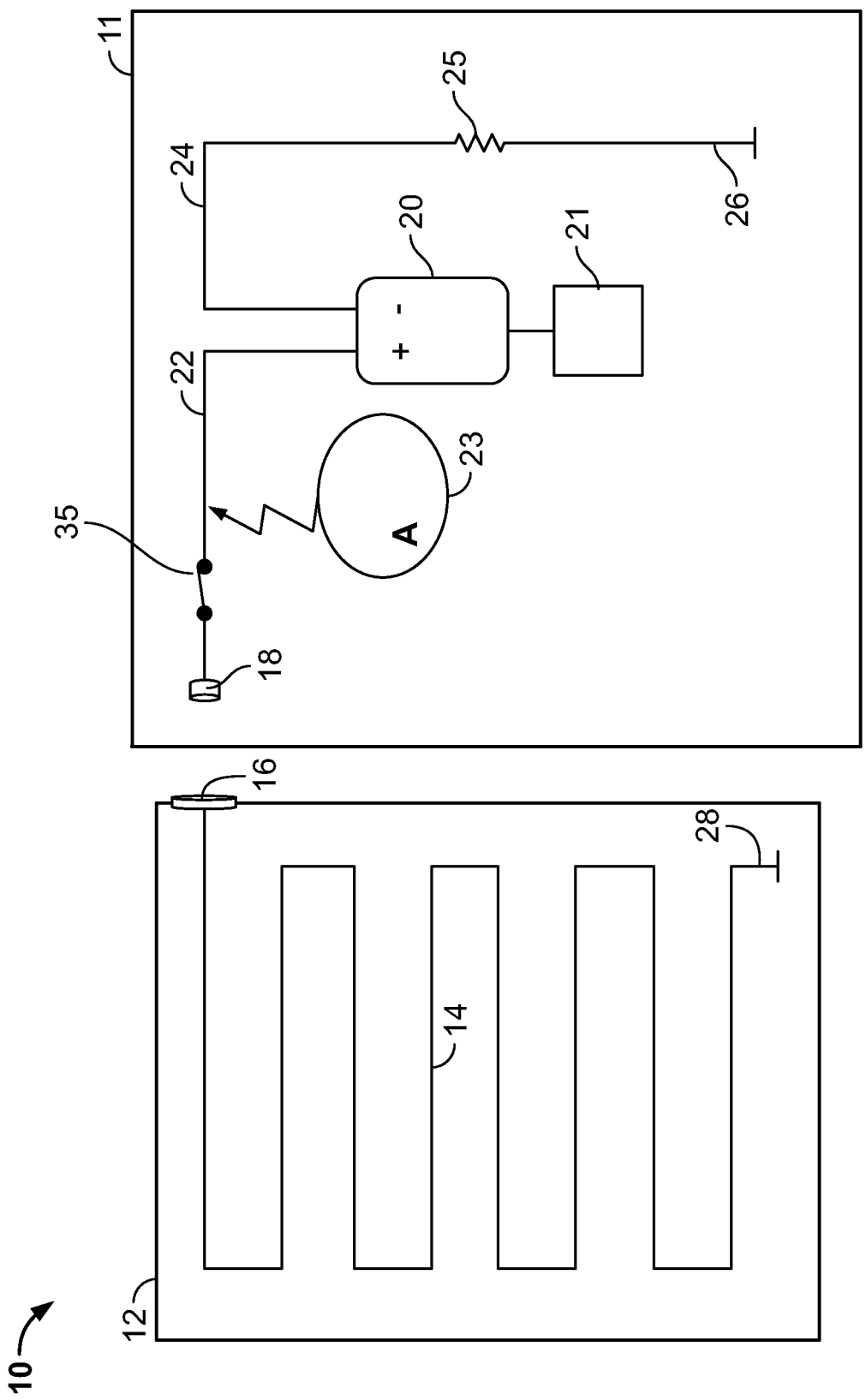
FIG. 1 shows a schematic circuit diagram of an exemplary embodiment of a magnetic electrical contact sensor of the present invention.

Referring to FIG. 1, a magnetic electrical contact sensor system of the present disclosure is shown, as indicated by arrow 10. An enclosure 11 has an access panel 12. Access panel 12 includes a meandering conductor path 14 in electrical communication with a conductive contact pad 16. A magnetic electrical contact 18 is disposed opposite contact pad 16, as described in greater detail below. Magnetic electrical contact 18 is electrically conductive and is connected to a positive terminal of a power source 20 via conductor 22. A conductor 24 is connected to the negative terminal of power source 20 and completes a circuit to conductor path 14 through a circuit contact 26. Circuit contact 26 is detachably connected to circuit contact 28 in access panel 12.

Referring next to FIG. 2, a cross-sectional view of magnetic electrical latch assembly 30 is shown. Latch assembly 30 is disposed opposite access panel 12 in an open position, with a gap 17 separating contact pad 16 and magnetic electrical contact 18, indicating that access panel 12 is in the open position. When in the open position, current flow is interrupted through magnetic electrical contact 18. Magnetic electrical contact 18 is disposed on a slide cylinder 42 (FIG. 3) and connected via conductor 22 to an optional bolt connector assembly 35. Assembly 35 includes a pair of electrically conductive, internally threaded fasteners, or nuts 34, 36 disposed in an insulator block 38. Nuts 34 and 36 are coaxially aligned within insulator block 38 and arranged to receive a bolt 40 through an aperture 33. Conductor 22 connects magnetic electrical contact 18 to nut 36. Nuts are physically separated by insulator block 38 to prevent electrical continuity therebetween. When bolt 40 is threadedly inserted through access panel 12 and into both nuts 34, 36, making electrical continuity between nuts 34, 36, current may flow between nuts 34, 36, allowing continuity through conductor 22 to power source 20.

Referring next to FIG. 3, access panel 12 is shown in the closed position, magnetic electrical contact 18 is attached to slide cylinder 42. Slide cylinder 42 is disposed within an annular cylindrical cavity 46. Flanges 44 are disposed at one end of cavity 46 to limit movement of slide cylinder 42. Slide cylinder 42 is slidable within cavity 46. A raised shoulder portion 48 on slide cylinder contacts flanges 44 to retain slide cylinder 42 within cavity 46, e.g., when access panel is removed and magnetic flux between magnetic electrical contact 18 and contact pad 16 is interrupted. As indicated by arrow 49, access panel 12 and bolt 40 are movable to engage latch assembly 30 at a front surface. Slide cylinder 42 is slidable within cavity 46 to allow latch assembly 30 to secure access panel 12. The slidable movement of slide cylinder 42 and magnetic electrical contact 18 compensate for any geometric inconsistencies between access panel 12 and the enclosure 11 frame. Magnetic electrical contact 18 and slide cylinder 42 have a defined range of flexibility within cavity 46 to allow latch assembly 30 to function properly.

In an embodiment, magnetic electrical contact 18 may be a neodymium iron boron magnet connected to a twenty gauge (20 AWG) wire 22. Plastic cavity 46 directs the magnet to conductive pad 16. The plastic cavity 46 is longer axially than slide cylinder 42 to provide a hollow annulus in which slide cylinder 42 may move freely to accommodate for geometric inconsistencies and mechanical tolerance. Cavity 46 also restricts the magnet from falling out of housing 35 when the access panel 12 is removed. When a magnetic material is brought near the magnet, it can slide forward, extending out of housing 35, while remaining captured. In an exemplary embodiment, magnetic electrical contact 18 and slide cylinder 42 may extend from housing 35 approximately 0.375 inch (0.9525 centimeters). This dimension may be varied based on mechanical design tolerances for the panel enclosure.

The magnetic electrical contact sensor system 10 provides a circuit that detects tamper or breach of access panel 12. When magnetic electrical contact 18 magnetically couples with contact pad 16 attached to panel 12, they complete the electrical circuit flowing through conductor 14 and contact pad 16 in access panel 12, and through conductor 22 in latch assembly 30, creating a complete barrier to intruders.

Bracket housing 32 houses the sliding magnetic electrical contact 18 and includes a pathway directing wire 22 to bolt assembly 35. Wire 22 is attached to the magnet, e.g., using solder or conductive adhesive. The magnetic electrical contact 18 and cylinder 42 are housed in a plastic cavity that is able to slide forward and aft inside the bracket housing 32, allowing bracket assembly to be placed in the vicinity of the conductive pad 16 on panel 12.

Meandering wire 14 is shown schematically in FIG. 1. Wire 14 may be embedded inside access panel 12 along a serpentine pattern. Wire 14 exits panel 12, and is connected to conductive pad 16 on the surface of panel 12. Magnetic electrical contact 18 couples magnetically to contact pad 16 and completes a conductive electrical connection. When the panel 12 comes near magnetic electrical contact 18, the magnet extends out of the bracket and makes contact with panel 12.

Latch assembly 30 is mounted to the interior of the enclosure 11 on an interior surface or frame bracket (not shown), making it easy to install and implement. As the latch assembly 30 is disposed internally, tampering with bolt 40 will cause an open circuit in every instance. When bolt 40 is removed, current cannot flow between nuts 34, 36 and therefore the electrical circuit is broken. Alternatively if panel 12 is removed without removing the bolt, the magnet connection will also break the electrical circuit, triggering an alarm 23.

Figure 4:
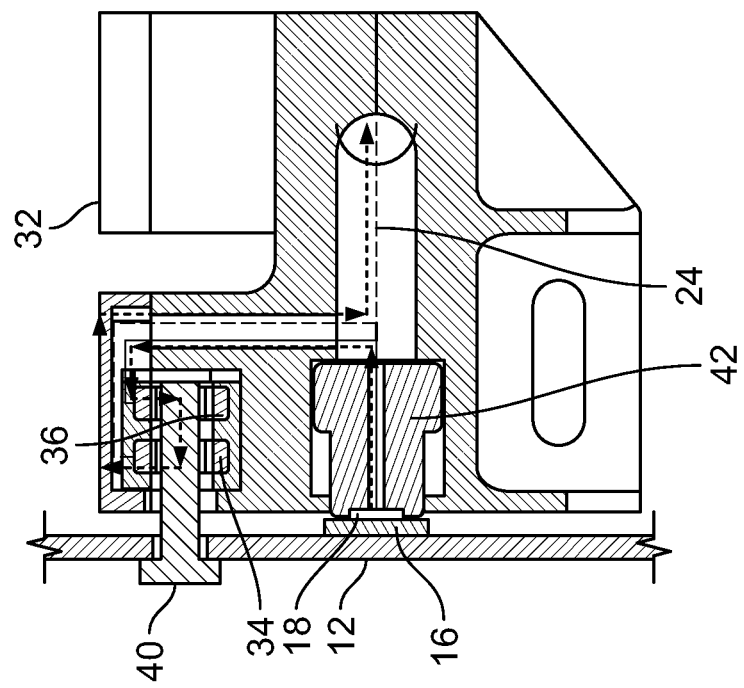
FIG. 4 shows the cross-sectional elevation of the magnetic contact sensor of FIG. 3 with current flow through the sensor contacts and a bolt threadedly inserted into fasteners to complete the detection circuit.

Referring next to FIG. 4, a cross-sectional elevation of the latch assembly 30 of magnetic electrical contact sensor 10 is shown, with current flowing through the sensor contacts 16, 18. Bolt 40 is threadedly inserted into fasteners 34, 36 to complete the detection circuit through conductor 24.

In an embodiment, meandering wire 14 may be embedded in access panel 12, and terminated at the conductive pad 16. Access panel 12 protects any sensitive material inside enclosure 11 through this detection technique. Also, meandering wire may be in electrical communication with one or more interior surfaces of the enclosure, essentially covering the entire surface with a breach detection feature. Any external penetration of enclosure 11 will interrupt current in the electrical circuit and generate an alarm.

In an embodiment, one or more resistors 25 may be connected in series with the meandering conductor 14 and other circuit elements. An interrogator 21 may be arranged to monitor the resistance of the circuit within a predetermined range. If an adversary attempts to short circuit the conductive path, e.g., via inserting a jumper wire across the magnetic electrical contact or bolt assembly, the interrogator may detect a change in the circuit resistance and generate an alarm.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

The present application contemplates methods, systems and program products on any machine-readable media for accomplishing its operations. The embodiments of the present application may be implemented using an existing computer processors, or by a special purpose computer processor for an appropriate system, incorporated for this or another purpose or by a hardwired system.

It is important to note that the construction and arrangement of the magnetic electrical contact sensor, as shown in the various exemplary embodiments is illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

It should be noted that although the figures herein may show a specific order of method steps, it is understood that the order of these steps may differ from what is depicted. Also two or more steps may be performed concurrently or with partial concurrence. Such variation will depend on the software and hardware systems chosen and on designer choice. It is understood that all such variations are within the scope of the application. Likewise, software implementations could be accomplished with standard programming techniques with rule based logic and other logic to accomplish the various connection steps, processing steps, comparison steps and decision steps.

The invention claimed is:

1. A magnetic electrical latch assembly comprising:
   a housing for supporting a magnetic electrical contact;
   the housing comprising an annular cavity and a cylinder disposed within the cavity;
   the magnetic electrical contact attached at one end to the cylinder;
   the cylinder movable axially within the cavity; and
   the magnetic electrical contact connected to a first conductive wire; the magnetic electrical contact arranged to couple with an opposing contact pad to create an electrical connection between the opposing contact pad and the magnetic electrical contact;
   wherein the cylinder is freely, slidably movable within the annular cavity.

2. The magnetic electrical latch assembly of claim 1, wherein the housing further comprises a bolt assembly;
   the bolt assembly comprising a first threaded fastener and a second threaded fastener; and a wire path for receiving a first conductive wire.

3. The magnetic electrical latch assembly of claim 2, wherein the magnetic electrical contact is in electrical communication with the first threaded fastener via the first conductive wire.

4. The magnetic electrical latch assembly of claim 3, wherein the first threaded fastener and the second threaded fastener are disposed in coaxial alignment in an insulated block to maintain a separation distance between the first threaded fastener and the second threaded fastener.

5. The magnetic electrical latch assembly of claim 4, wherein a continuous electrical path between the magnetic electrical contact and the power source is created when a bolt is inserted in the first threaded fastener and the second threaded fastener.

6. The magnetic electrical latch assembly of claim 5, wherein the second threaded fastener is in electrical communication with a power source via a second conductive wire.

7. The magnetic electrical latch assembly of claim 1, wherein the cylinder having a raised shoulder portion and the annular cavity closed at one end and having a flange disposed at an opposing end of the cavity; the flange arranged to contact the shoulder portion to limit movement of the cylinder within the sleeve.

8. The magnetic electrical latch assembly of claim 1, wherein the cylinder is slidable within the cavity to compensate for a gap between an access panel and an enclosure frame.

9. The magnetic electrical latch assembly of claim 1, wherein the opposing contact pad is located outside of the housing.

10. A magnetic electrical contact sensor system comprising:
    a hollow enclosure; a detachable access panel attached to a side of the enclosure; a meandering conductor path arranged to cover at least a portion of the access panel, the meandering conductor path in electrical communication with a conductive contact pad;
    a magnetic electrical latch assembly having a housing for supporting a magnetic electrical contact within the enclosure;
    the housing comprising an annular cavity and a cylinder disposed within the cavity;
    the magnetic electrical contact attached at one end to the cylinder;
    the cylinder movable axially within the cavity; and
    the magnetic electrical contact connected to a first conductive wire; the magnetic electrical contact arranged to couple with an opposing contact pad to create an electrical connection between the opposing contact pad and the magnetic electrical contact;

wherein the cylinder is freely, slidably movable within the annular cavity.

11. The system of claim 10, wherein the magnetic electrical contact is disposed opposite the contact pad when the access panel is in a closed position; and the magnetic electrical contact engages the contact pad to complete an electrical circuit to a power source.

12. The system of claim 10, wherein electrical current is interrupted through the magnetic electrical contact when the access panel is in an open position, with a gap separating the contact pad and the magnetic electrical contact.

13. The system of claim 10, wherein the housing further comprises a bolt assembly; the bolt assembly comprising a first threaded fastener and a second threaded fastener; and a wire path for receiving a first conductive wire and wherein the magnetic electrical contact is in electrical communication with the first threaded fastener via the first conductive wire.

14. The magnetic electrical latch assembly of claim 13, wherein the first threaded fastener and the second threaded fastener are disposed in coaxial alignment in an insulated block to maintain a separation distance between the first threaded fastener and the second threaded fastener.

15. The magnetic electrical latch assembly of claim 14, wherein a continuous electrical path between the magnetic electrical contact and the power source is created when a bolt is inserted in the first threaded fastener and the second threaded fastener.

16. The magnetic electrical latch assembly of claim 15, wherein the second threaded fastener is in electrical communication with a power source via a second conductive wire.

17. The magnetic electrical latch assembly of claim 15, wherein the bolt is threadedly inserted through the access panel and into both nuts, the first threaded fastener and the second threaded fastener, to retain the access panel on the enclosure; the bolt making electrical continuity between the first threaded fastener and the second threaded fastener.

18. The system of claim 10, wherein the second conductive wire is connected to a negative terminal of the power source and completes a circuit to the meandering conductor path through a first circuit contact; the circuit contact being detachably connected to a second circuit contact mounted on the access panel.

19. An alarm system for securing an enclosure comprising:

a hollow enclosure; a detachable access panel attached to a side of the enclosure; a meandering conductor path arranged to cover at least a portion of the access panel, the meandering conductor path in electrical communication with a conductive contact pad;

a magnetic electrical latch assembly having a housing for supporting a magnetic electrical contact within the enclosure;

the housing comprising an annular cavity and a cylinder disposed within the cavity;

the magnetic electrical contact attached at one end to the cylinder;

the cylinder movable axially within the cavity;

the magnetic electrical contact connected to a first conductive wire; the magnetic electrical contact arranged to couple with an opposing contact pad to create an electrical connection between the opposing contact pad and the magnetic electrical contact; and one or more resistors connected in series with the meandering conductor path; and an interrogator for monitoring a resistance value of the meandering conductor path;

wherein the cylinder is freely, slidably movable within the annular cavity.

20. The alarm system of claim 19, further comprising:

an alarm signal device;

wherein the system is configured to trigger the alarm signal device in response to detecting an interruption of current in the meandering conductor path, the first conductor wire or the second conductor wire.

\* \* \* \* \*